(12) United States Patent
Ichikawa (10) Patent No.: US 7,968,922 B2
(45) Date of Patent: Jun. 28, 2011

(54) SEMICONDUCTOR APPARATUS, SOLID STATE IMAGE PICKUP DEVICE USING THE SAME, AND METHOD OF MANUFACTURING THEM

(75) Inventor: Takeshi Ichikawa, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/703,977

(22) Filed: Feb. 11, 2010

(65) Prior Publication Data
US 2010/0140457 A1    Jun. 10, 2010

Related U.S. Application Data

(62) Division of application No. 10/585,733, filed as application No. PCT/JP2005/006226 on Mar. 24, 2005, now Pat. No. 7,687,299.

(30) Foreign Application Priority Data

Mar. 30, 2004 (JP) .................... 2004-099346

(51) Int. Cl.
*H01L 31/112* (2006.01)
(52) U.S. Cl. .................... 257/290; 257/E27.133
(58) Field of Classification Search .......... 257/291, 257/292, E21.412, 290, E27.113
See application file for complete search history.

(56) References Cited

U.S. PATENT DOCUMENTS

| | | | |
|---|---|---|---|
| 5,438,211 A | 8/1995 | Nakamura et al. | 257/239 |
| 5,880,494 A * | 3/1999 | Watanabe | 257/225 |
| 6,100,551 A * | 8/2000 | Lee et al. | 257/232 |
| 6,150,682 A | 11/2000 | Sawada et al. | 257/290 |
| 6,337,248 B1 | 1/2002 | Imai | 438/279 |
| 6,747,318 B1 * | 6/2004 | Kapre et al. | 257/368 |
| 7,102,677 B2 | 9/2006 | Watanabe | 348/308 |
| 2001/0013899 A1 | 8/2001 | Watanabe | 348/294 |
| 2002/0164858 A1 | 11/2002 | Sayama et al. | 438/289 |
| 2004/0263657 A1 * | 12/2004 | Sakamoto et al. | 348/311 |
| 2005/0247941 A1 | 11/2005 | Adachi | 257/72 |
| 2006/0158541 A1 | 7/2006 | Ichikawa | 348/308 |

FOREIGN PATENT DOCUMENTS

| | | |
|---|---|---|
| EP | 0 948 056 A2 | 10/1999 |
| JP | H07-297295 | 11/1995 |
| JP | 07-321220 A | 12/1995 |
| JP | 7-321220 A | 12/1995 |
| JP | 11-274454 A | 10/1999 |
| JP | 2000-077613 A | 3/2000 |
| JP | 2000-353756 A | 12/2000 |
| JP | 2001-309243 A | 11/2001 |
| JP | 2002-329793 A | 11/2002 |
| JP | 2003-333431 A | 11/2003 |
| JP | 2004-158508 A | 6/2004 |

\* cited by examiner

*Primary Examiner* — Evan Pert
*Assistant Examiner* — Selim Ahmed
(74) *Attorney, Agent, or Firm* — Fitzpatrick, Cella, Harper & Scinto (57) ABSTRACT

The invention provides a semiconductor apparatus provided with at least one set of buried channel type first conductive type MOS transistor and surface channel type first conductive type MOS transistor on the same substrate, in which a first conductive type impurity region is provided below a gate electrode of the buried channel type and surface channel type MOS transistors and between source drain regions. Further, the invention provides a solid state image pickup device having a photoelectric conversion portion and a pixel including a plurality of transistors formed in correspondence to the photoelectric conversion portion, in a substrate, wherein the plurality of transistors includes a buried channel type first conductive type MOS transistor and a surface channel type first conductive type MOS transistor, and a first conductive type impurity region is provided below a gate electrode of the buried channel type and surface channel type MOS transistors and between source drain regions.

11 Claims, 9 Drawing Sheets

SEMICONDUCTOR APPARATUS, SOLID STATE IMAGE PICKUP DEVICE USING THE SAME, AND METHOD OF MANUFACTURING THEM

CROSS REFERENCE TO RELATED APPLICATIONS

The present application is a division of U.S. application Ser. No. 10/585,733 filed on Jul. 12, 2006, which is a U.S. national-stage entry of International Application No. PCT/JP2005/006226 filed on Mar. 24, 2005. The entire disclosures of these earlier applications are incorporated by reference herein.

TECHNICAL FIELD

The present invention relates to a semiconductor apparatus and a solid state image pickup device using the same, and more particularly to a CMOS image sensor and a method of manufacturing the same.

BACKGROUND ART

As a typical solid state image pickup device, there are apparatuses called as a CCD sensor constituted by a photodiode and a CCD shift register, and a CMOS sensor such as an active pixel sensor (APS) constituted by a photodiode and a MOS transistor, and the like.

The APS includes a photodiode, a MOS switch, an amplifier circuit for amplifying a signal from the photodiode and the like within a pixel. Further, the APS has a lot of advantages such that an XY addressing can be executed and a sensor and a signal processing circuit can be formed as one chip. However, on the other hand, since a number of devices within one pixel is large, a pixel aperture ratio is small. Further, it is hard to reduce a chip size which determines a magnitude of an optical system, and the CCD accounts for a large percentage of a market.

In recent years, the CMOS sensor draws the attention on the basis of an improvement of a micro forming technique of the MOS transistor and an increase of requests for making the sensor and the signal processing circuit by one chip and making an electric power consumption low.

Figure 5:
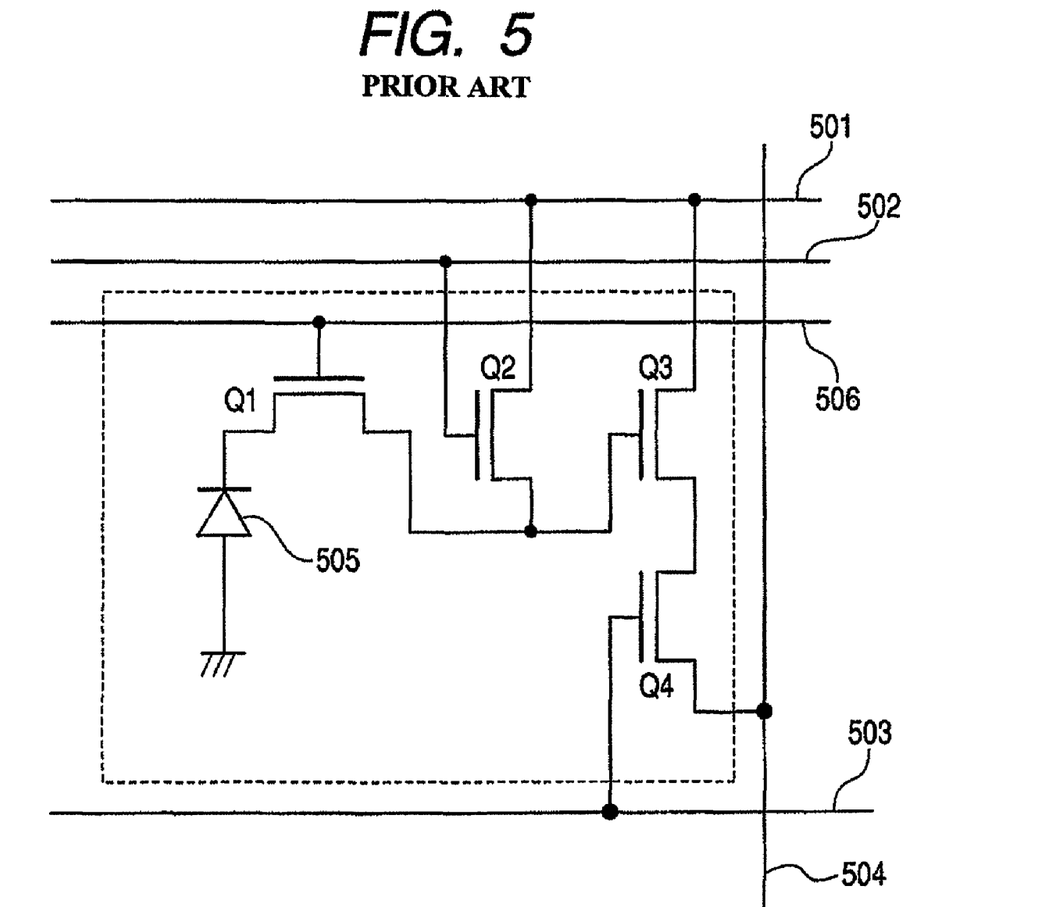
FIG. 5 is a view of an equivalent circuit of a pixel in a solid state image pickup device.

FIG. 5 shows an example of an equivalent circuit of the APS (for example, Japanese Patent Application Laid-Open No. H11-274454 (corresponding to EP Laid-Open Publication No. 948056A2)).

Reference numeral 501 denotes a power source line, reference numeral 502 denotes a reset switch line selecting a reset transistor, reference numeral 503 denotes a select switch line selecting a select transistor, reference numeral 504 denotes a signal output line, reference numeral 505 denotes a photodiode serving as a photoelectric conversion portion, reference numeral 506 denotes a transfer switch line for selecting a transfer transistor, reference symbol Q1 denotes a transfer transistor, reference symbol Q2 denotes a reset transistor, reference symbol Q3 denotes a transistor for amplifying, and reference symbol Q4 denotes a select transistor. The photoelectric conversion portion corresponds to an embedded type photodiode used in a CMOS, CCD or the like. The embedded type photodiode is structured such that a region having a high impurity density (for example, a p-type semiconductor region) is provided in a surface. Accordingly, it is possible to restrict a dark current generated in an SiO2 surface, a junction capacitance can be provided between a storage unit (for example, an n-type semiconductor region) and the p-type semiconductor region in the surface, and it is possible to increase a saturation charge amount of the photodiode.

A light signal charge Qsig stored in the photoelectric conversion portion 505 is read in a floating diffusion area via the element Q1. The element Q2 resets an electric potential of the floating diffusion area.

The charge is voltage converted into a signal charge Qsig/CFD on the basis of a capacity CFD of the floating diffusion area, and the signal is read through the element Q3. The element Q4 is a select switch for selecting a line.

As mentioned above, a plurality of MOS transistors are provided within the pixel. As a classification of the MOS transistor structure, there is a classification obtained by a region in which a channel is formed. This is classified into a surface channel type MOS transistor in which a channel portion is formed near a substrate surface, and a buried channel type MOS transistor in which the channel portion is formed at a deep position of the substrate apart from the surface. It is often the case that the surface channel type MOS transistor is normally used as the MOS transistor within the pixel, however, there is a solid state image pickup device using the buried channel type MOS transistor as the reset transistor and the transfer transistor (for example, refer to Japanese Patent Application Laid-Open No. 2001-309243 (U.S. Patent Publication No. 2001-013899))

Further, there has been a problem that a noise component is included in an output voltage due to a 1/f noise generated in the transistor Q3 in a source follower portion. Accordingly, in the CCD, there has been proposed a method of forming the source follower portion in the final stage by a buried channel type pMOS transistor (for example, U.S. Pat. No. 5,438,211).

However, in the case that the surface channel type MOS transistor and the buried channel type MOS transistor of the same conductive type are arranged within the same substrate, a process becomes complicated and a cost increase is caused.

Further, not being limited to the solid state image pickup device, in the case that the surface channel type MOS transistor and the buried channel type MOS transistor of the same conductive type are both provided within the chip, there has been a problem that a manufacturing process thereof becomes complicated.

Accordingly, an object of the present invention is to form a semiconductor apparatus having a surface channel type MOS transistor and a buried channel type MOS transistor of the same conductive type on the same substrate in accordance with a simple process. Further, an object of the present invention is to provide a semiconductor apparatus having a reduced noise and a manufacturing method thereof on the basis of a simple structure.

DISCLOSURE OF THE INVENTION

In order to achieve the object mentioned above, in accordance with the present invention, there is provided a semiconductor apparatus having both a buried channel type first conductive MOS transistor and a surface channel type first conductive MOS transistor, wherein a first conductive type channel doped layer exists near a surface in both of the buried channel type and surface channel type MOS transistors. Further, in the case of using the buried channel type transistor in a source follower type MOS transistor in an output portion of a solid state image pickup device, it is possible to form a solid state image pickup device having a reduced noise, and this structure is particularly effective in the case that the source follower MOS transistor is provided in the pixel portion as in a CMOS image sensor.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and, together with the description, serve to explain the principles of the invention.

BEST MODE FOR CARRYING OUT THE INVENTION

Next, a description will be given of a best mode of the present invention with reference to the accompanying drawings, by exemplifying a solid state image pickup device.

Figure 1:
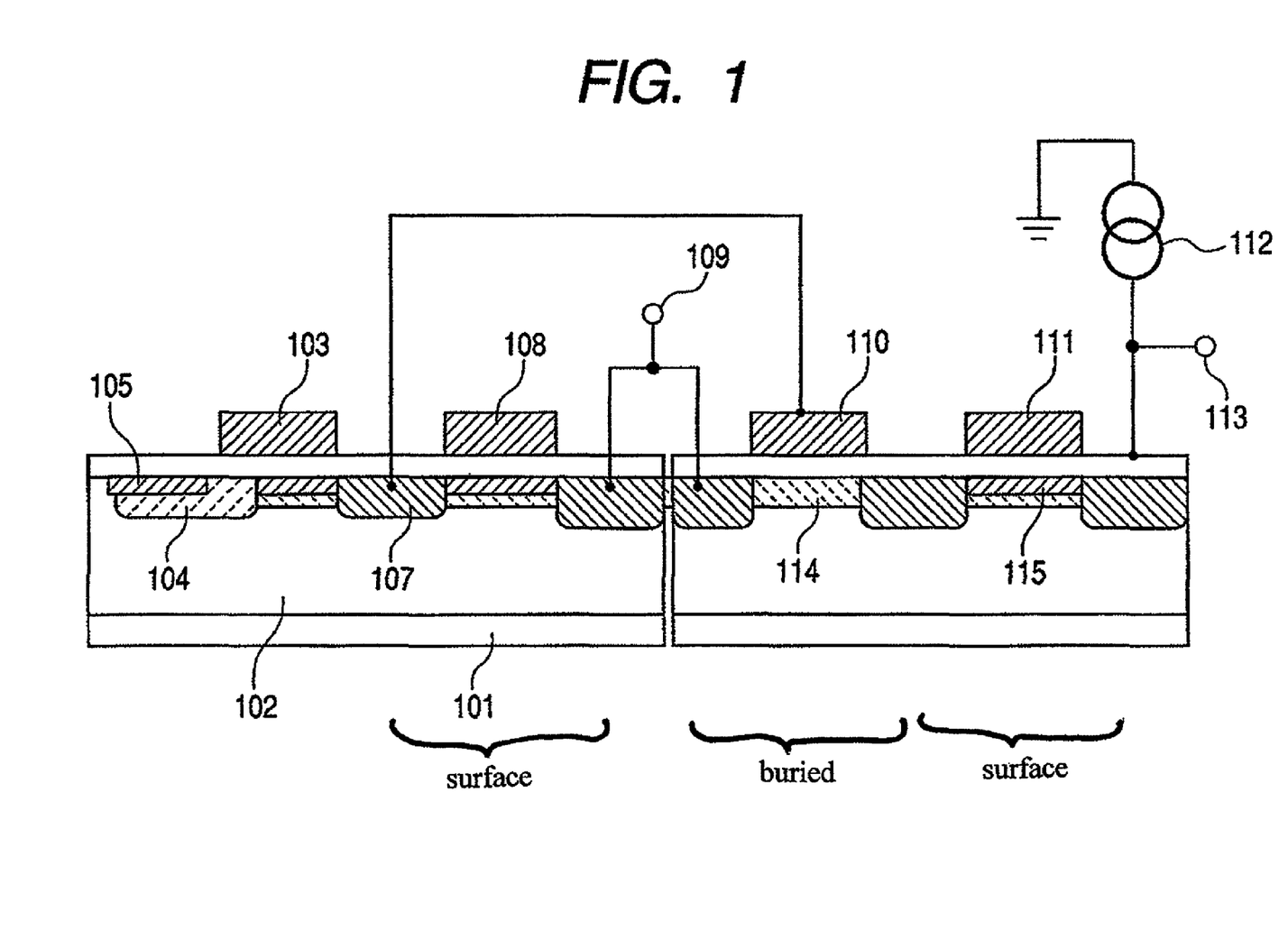
FIG. 1 is a view showing an embodiment in accordance with the present invention.

FIG. 1 is a view of a cross sectional structure best showing features of the present invention. In FIG. 1, a photodiode forming a photoelectric conversion device is constituted by a p-type well 102 existing on an n-type substrate 101, an n-type semiconductor region 104 forming a charge storage region, and a p-type semiconductor region 105 for making the photodiode in an embedded structure. Reference numeral 103 denotes a gate electrode of a transfer MOS transistor for transferring a signal charge obtained by the photodiode to a diffusion floating region (FD) 107. The FD 107 is connected to a gate electrode 110 of an amplifying MOS transistor. Reference numeral 108 denotes a gate electrode of a reset MOS transistor for applying a reset potential, and reference numeral 109 denotes a power source for applying the reset potential.

Reference numeral 111 denotes a gate electrode of a select MOS transistor for selecting a pixel. Reference numeral 112 denotes a current source, and reference numeral 113 denotes an output terminal. A drain of the MOS transistor 111 for selecting a line is connected to a source of the amplifying MOS transistor. In this case, the source of the amplifying MOS transistor and the drain of the line selecting MOS transistor are formed in the common semiconductor region.

Further, the power source 112 forming a load of the amplifying MOS transistor is connected to the source of the line selecting switch MOS transistor 111 so as to structure a source follower amplifying circuit.

In the present invention, the structure is made such that the surface channel type MOS transistor and the buried channel type MOS transistor are arranged at least a pair within the same substrate. Further, a semiconductor region which is the same conductive type as the source drain region is formed in a region which is below the gate electrodes of both the MOS transistors and between the source drain regions. Accordingly, it is possible to achieve a buried channel structure and it is possible to lower a substrate biasing effect of the surface channel type MOS transistor.

In the structure in FIG. 1, the buried channel type MOS transistor is used in the amplifying MOS transistor 110. In accordance with the structure mentioned above, it is further possible to reduce a 1/f noise.

The other MOS transistors than the source follower transistor are constituted here, for example, by a surface channel type MOS transistor having a threshold voltage of 0.4 V.

Next, a description will be given in detail of the feature of the present invention while describing a reading operation. An electron which is generated by an incident light in accordance with a photoelectric conversion is stored in the n-type semiconductor region 104 of the photodiode. At this time, the transfer MOS transistor is in an OFF state. After a predetermined storing time has passed, a positive voltage is applied to the gate electrode 103 of the transfer MOS transistor so as to set the transfer MOS transistor in an ON state, and a stored charge in the n-type semiconductor region 107 of the photodiode is transferred to the FD 107. Before setting the transfer MOS transistor to the ON state, the FD is reset to a predetermined voltage. When the stored charge is transferred to the FD, the voltage of the FD is lowered at a degree of Qsig/CFD from the reset voltage in the case of using a transfer charge Qsig and an FD capacity CFD, because the transfer charge is constituted by the electron. If the storing layer of the photodiode is of the p-type, the transfer charge is constituted by a hole and the voltage is inversely increased.

In the APS mentioned above, it is possible to remove most of the noise component in the reset noise of the diffusion floating region 107 in accordance with the following method.

The method is constituted by a method of temporarily holding an output signal Vr1 just after the reset of the FD 107 and acquiring a difference (Vsig1−Vr1) between the output signal Vr1 and an output signal Vsig1 obtained by superposing the component Qsig/CFD on the reset signal. In particular, in the case that the photodiode and the transfer MOS transistor 103 satisfy a condition mentioned below, it is possible to achieve a higher noise rejection ratio. In other words, it is important to read the signal charge stored in the n-type semiconductor region of the photodiode at a higher rate.

A description will be given in detail. A voltage of the FD which is lowered at a voltage of Qsig/CFD from the reset voltage after reading the signal is set to VFDsig1. In this case, if the transfer MOS transistor is in a sufficient ON state, a reverse bias of the VFDsig1 is applied to a GND potential in the p-type well and the p-type semiconductor region having the high surface impurity density, in the n-type semiconductor region of the photodiode. At this time, a depletion layer extends to the n-type semiconductor region from the p-type well and the p-type semiconductor region having the high surface impurity density, and an entire of the n-type semiconductor region of the photodiode is depleted, whereby it is possible to read the signal charge in the FD with hardly remaining the signal charge in the photodiode.

In this case, at the same time of reading the signal charge in the FD, the reset of the photodiode is executed. After reading, that is, in a state in which the reverse bias of the VFDsig1 is applied to the n-type semiconductor region of the photodiode, it is assumed that a number of the electron remaining in the n-type semiconductor region is 0. Accordingly, it is possible to completely remove the reset noise by acquiring the difference between the output signal Vr1 just after the reset and the output signal Vsig1 obtained by superposing the component Qsig/CFD on the reset signal. Further, it is possible to obtain an output signal obtained by an expression Vsig1−Vr1=Qsig/CFD×A (reference symbol A denotes a gain of an output circuit existing in each of the pixels).

A noise ΔVn1 of the output circuit existing in each of the pixels such as a 1/f noise or the like is superposed on the output signal. Further, a noise ΔVn2 in a reading system after the output circuit in each of the pixels is superposed on the output from an integrated circuit IC formed as a final area sensor.

In order to achieve the reading mentioned above, it is necessary to apply the reverse bias to the n-type semiconductor region of the photodiode and set a relation Vdep<Vsign1 in which the voltage making the entire of the n-type semiconductor region to deplete is set to Vdep. In this case, the depletion voltage of the photodiode broadly means a reverse bias voltage satisfying a relation stored charge number in storage unit (n-type semiconductor region)<net impurity number (number obtained by subtracting number of all acceptors from number of all donors). Ideally, a number of the electrons remaining in the n-type semiconductor region of the photodiode after reading is 0, however, it is a design matter how much the reading is executed.

Even if the reset noise is removed in accordance with the method mentioned above, the ΔVn1 is subject to the 1/f noise or the like. In this case, there can be considered a method of making a gate oxide film thin, a method of clarifying the surface and the like.

However, if the buried channel type MOS transistor is employed, a very great effect can be obtained.

In the case of forming the buried channel type MOS transistor, an impurity 114 of the same conductive type as the source drain region is doped in the channel portion, and a lowest potential region is formed in a region which is slightly deeper than the surface. In order to keep a low cost, it is necessary to execute a channel doping step of the buried channel type transistor without executing a patterning. In other words, the impurity 114 is doped in all the surface of the substrate including the region which is below the gate electrode of the other MOS transistor than the buried channel type MOS transistor and between the source drain regions.

In order to minimize an effect applying to the other transistors, it is necessary to reduce a doping amount. In order to reduce the doping amount, it is preferable to employ the well of the same conductive type as the source drain region as the well in which the source drain region is formed. In this case, the structure tends to be made such that the transistor does not turn off even at the gate voltage of 0 V, however, there is no problem in view of the MOS transistor of the source follower. It is preferable to use in a range in which a linearity is kept.

There is a case that an off characteristic and a low substrate bias effect are required in the other transistors than the source follower portion.

In the off characteristic, a threshold voltage is controlled by doping a conductive type impurity 115 which is different from the impurity 114 in the region below the gate electrode of the desired MOS transistor and between the source drain regions. In comparison with the same conductive type channel doping amount as the impurity 114 used in the buried channel type MOS transistor, the different conductive type impurity 115 is injected more to the normal surface channel type transistor. Accordingly, it is possible to control the threshold voltage so as to be an enhance type. In view of a depth, the semiconductor region for the buried channel is formed slightly deeper from the surface, and the semiconductor region for the surface channel is formed in a region close to the surface than the semiconductor region for the buried channel. In accordance with this structure, it is possible to execute the same conductive type channel dope as the impurity region for the buried channel in one step without patterning.

Accordingly, it is possible to achieve the structure in which at least one set of the surface channel type MOS transistor and the buried channel type MOS transistor are arranged within the same substrate, on the basis of a simple process. Further, since the impurity region 114 for the buried channel is formed in the channel portion of the surface channel type MOS transistor, a substrate density below the channel portion (the impurity density of the source drain region and the reverse conductive type) becomes low, and it is possible to obtain an effect of reducing the substrate bias effect.

In this case, the first conductive type is not particularly limited. It is preferably of the n-type, and a dopant to the buried channel is preferably constituted by an arsenic in view of a controllability since a sharp profile to a shallow portion can be obtained. Further, it goes without saying that the conductive type of the well in which the source drain is formed is not particularly limited, and it may be constituted by the different conductive type well from the source drain region. A description will be given in detail of embodiments.

Embodiment 1

Figure 2A:
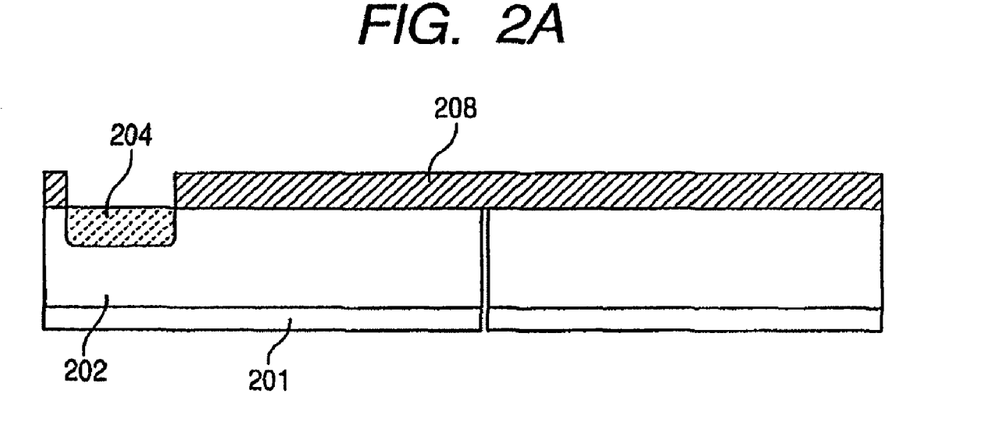
FIGS. 2A, 2B and 2C are cross sectional views showing a first embodiment in accordance with the present invention.

A description will be given of an embodiment 1 with reference to FIGS. 2A to 2C. A photodiode and a periphery thereof in accordance with the present embodiment are formed in accordance with the following procedure.

An n-type well 202 having a surface density of $2 \times 10^{16}$ cm$^{-3}$ is formed by implanting a phosphor or an arsenic to a p-type substrate 201 by using an ion implanter, and applying a heat treatment. Next, a p-type semiconductor region 204 of the photodiode is formed by forming a photo resist 208 (FIG. 2A).

A p-type first semiconductor region 205 is formed in an entire surface of the substrate by forming a gate oxide film in an entire surface of the substrate surface and thereafter implanting a boron at a doze amount of 2E12 cm$^{-2}$ and 35 keV in accordance with an ion implanting method. Next, an n-type second semiconductor region 206 is formed by forming a photo resist in a region forming the buried channel type MOS transistor, and implanting a phosphor at 6E12 cm$^{-2}$ and 50 keV. An impurity profile of the channel portion of the surface channel type MOS transistor is shown in FIG. 3.

Figure 3:
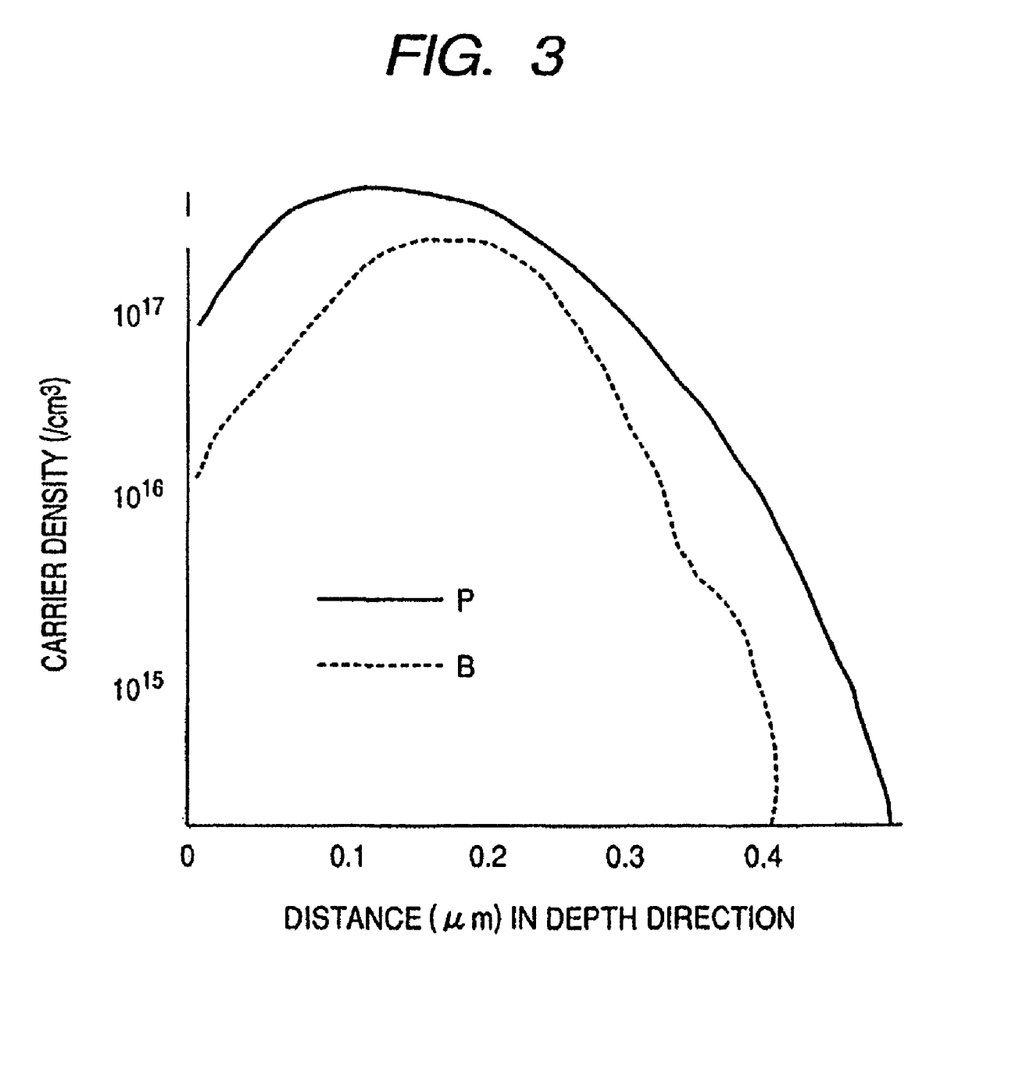
FIG. 3 is a view showing an impurity profile of the first embodiment in accordance with the present invention.

A density profile of the channel portion of the buried channel type MOS transistor corresponds to a profile in which the phosphor is not injected in the profile shown in FIG. 3. A potential is determined on the basis of the gate voltage and the density profile of the boron, and a valley of the potential exists at a position apart from the surface so as to achieve the buried channel. On the other hand, the phosphor is dominant as the impurity in the surface channel type as shown in FIG. 3 so as to determine the channel, however, a carrier is cancelled by the boron in the lower portion of the channel, and a carrier density becomes small, so that it is possible to reduce the substrate bias effect.

Figure 2B:
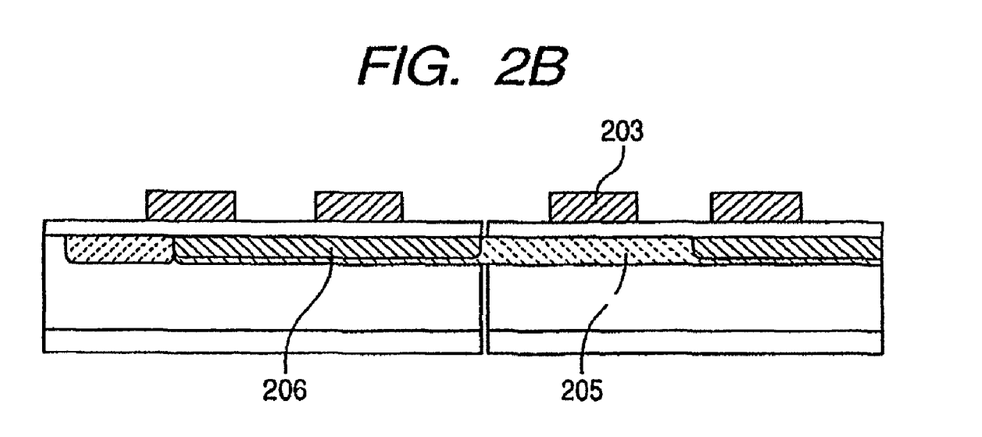
Figure 2C:
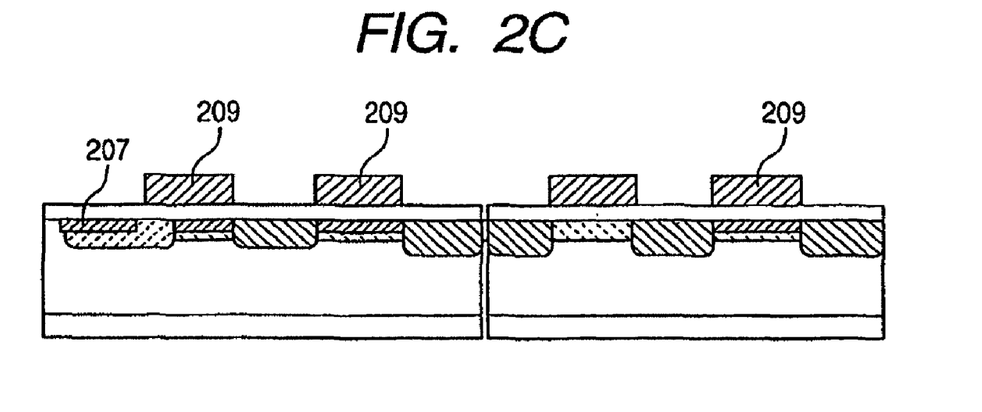

Next, a control electrode 203 of the source follower MOS transistor is formed by peeling the photo resist, thereafter forming a poly-silicon control electrode in which the phosphor is doped, and executing the patterning (FIG. 2B). Next, the photo resist is formed on the photodiode of the substrate surface and on the other region of a part of the control electrode, and an n-type semiconductor region 207 having a high impurity density is formed in the surface by using a control electrode of a transfer MOS transistor as a mask.

Next, the source train region is formed by ion implanting the boron to the p-type MOS transistor. Thereafter, the surface channel type MOS transistor is formed by covering the buried channel type MOS transistor by the photo resist, thereafter ion implanting the boron further, and making the poly-silicon control electrodes of the transfer MOS transistor, the reset MOS transistor and the select MOS transistor in a p-type (209).

In this step, the source drain region of the normal p-type MOS transistor including the peripheral circuit portion (not shown) is formed. The n-type MOS transistor is formed in accordance with the normal semiconductor process (FIG. 2C).

Thereafter, there are formed sequentially a first interlayer isolation film, a contact, a first metal wire, a second interlayer isolation film, a via connecting the first metal wire and the second metal wire, a second metal wire and a passivation film in accordance with the normal semiconductor manufacturing step.

As a result, there can be formed the buried channel type MOS transistor in which the poly-silicon control electrode is constituted by the n-type diffusion electrode, and the surface type MOS transistor in which the poly-silicon control electrode is constituted by the p-type diffusion electrode. In other words, the gate electrode of the buried channel type MOS transistor is constituted by the poly-silicon in which the second conductive type impurity of the reverse conductive type to the first conductive type injected to the channel portion is injected, and the gate electrode of the surface channel type MOS transistor is constituted by the poly-silicon in which the first conductive type impurity is injected.

Accordingly, it is possible to independently control the threshold voltages of the buried channel type MOS transistor and the surface type MOS transistor. The noise can be lowered to about one third in the case that the buried channel type MOS transistor is used in the source follower portion as in the present embodiment in comparison with the noise in the source follower portion in the case that all are formed by the surface channel type MOS transistor, whereby an improve characteristic can be obtained. Further, since the impurity density below the channel portion is also low in the surface channel MOS transistor, it is possible to obtain an improved output characteristic having a small substrate bias effect.

Embodiment 2

A description will be given of an embodiment 2 with reference to FIGS. 4A to 4F. A photodiode and a periphery thereof in accordance with the present embodiment are formed in accordance with the following procedure.

Figure 4A:
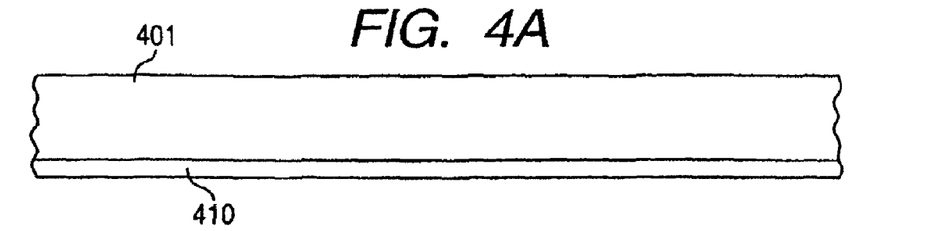
FIGS. 4A, 4B, 4C, 4D, 4E and 4F are cross sectional views showing a second embodiment in accordance with the present invention.
Figure 4B:
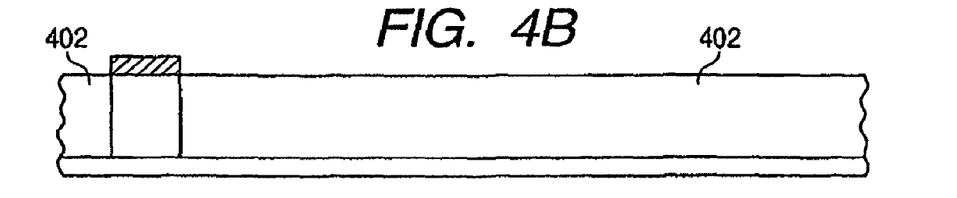
Figure 4C:
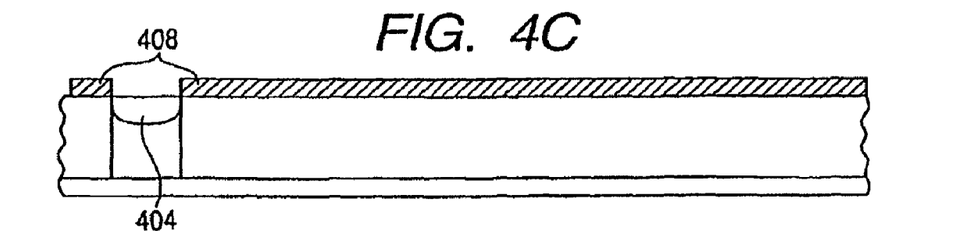

A deep p-type well 410 is formed by implanting a boron by using an ion implanter to an n-type substrate 401 (FIG. 4A). Next, a potential blocking layer to the n-type and a well 402 is prepared by ion implanting the boron to the other portions than the photo diode portion after the resist patterning (FIG. 4B). Next, a photo resist 408 is formed, and an n-type semiconductor region 404 of the photo diode is formed (FIG. 4C).

Figure 4D:
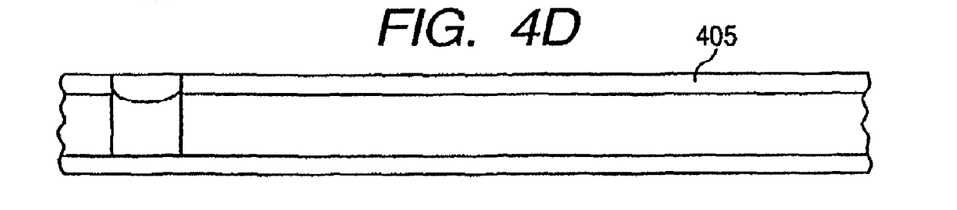
Figure 4E:
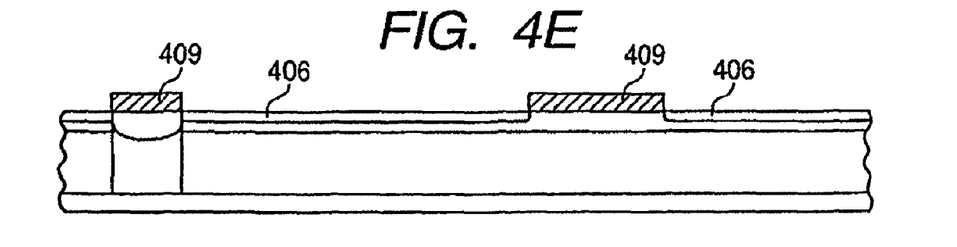

A first semiconductor region 405 is formed by implanting an arsenic to an entire surface of the substrate at a doze amount of 6E11 $cm^2$ and 60 keV without executing the patterning in accordance with an ion implanting method (FIG. 4D). Further, a second semiconductor region 406 is formed by forming a photo resist in the buried channel type MOS transistor portion and ion implanting a boron to a region below the gate electrode of the transistor for the surface channel and between the source drain regions at 2E12 $cm^{-2}$ and 20 keV (FIG. 4E). In the buried channel type, the potential is determined on the basis of the density profile, the gate voltage and the potential of the p-type well 402, and a valley of the potential exists at a position apart from the oxide film surface, and the buried channel is achieved as a path of the carrier. On the other hand, the boron is dominant as the impurity in the surface channel type and determines the potential. This is because the density of the boron is made larger in comparison with the density of the arsenic.

After forming the gate oxide film in an entire surface of the substrate surface, the patterning is executed by forming the poly-silicon control electrode in which the phosphor is doped at a high density. Next, a p-type semiconductor region 407 in which a surface impurity density is high, and a gate electrode 411 of the buried channel type MOS transistor doped by the boron are formed by forming a drain pattern of the photo resist on the photodiode of the substrate surface and in a partial region of the control electrode, and implanting the boron by using the gate electrode of the transfer MOS transistor as the mask.

Figure 4F:
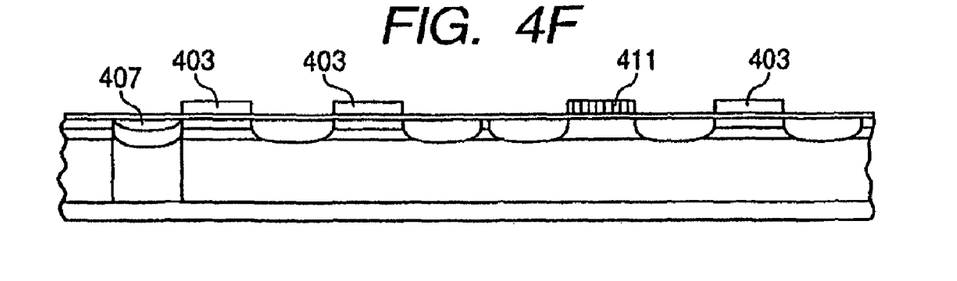

Thereafter, there are formed an n-type MOS transistor and a p-type MOS transistor, including the peripheral circuit portion (not shown) in accordance with the normal semiconductor process (FIG. 4F).

Further, there are formed sequentially a first interlayer isolation film, a contact, a first metal wire, a second interlayer isolation film, a via connecting the first metal wire and the second metal wire, a second metal wire and a passivation film in accordance with the normal semiconductor manufacturing step.

As a result, it is possible to independently control and form the threshold voltages of the buried channel type MOS transistor formed in the source follower portion and the other surface channel type MOS transistors. The noise can be lowered to about one third in the case that the buried channel type MOS transistor is used in the source follower portion as in the present embodiment in comparison with the noise in the source follower portion in the case that all are formed by the surface channel type MOS transistor, whereby an improve characteristic can be obtained. As is different from the embodiment 1, since the n-type MOS transistor is used in the pixel portion, a working speed is high, and the carrier generated by the light in the photo diode is constituted by the electron. Since a vessel having a larger potential is formed, a sensitivity is widely improved.

Embodiment 3

A description will be given of an embodiment 3 with reference to FIGS. 9A to 9F. In the present embodiment, a description will be given of an example in which the buried channel type MOS transistor and the surface channel type MOS transistor are controlled by the conductive type of the gate electrode.

The embodiment 3 is different from the embodiment 2 in a point that the semiconductor region of the reverse conductive type to the source drain region is not provided below the gate electrode of the surface channel type MOS transistor and between the source drain regions. A description will be given mainly of the different point from the embodiment 2.

Figure 9A:
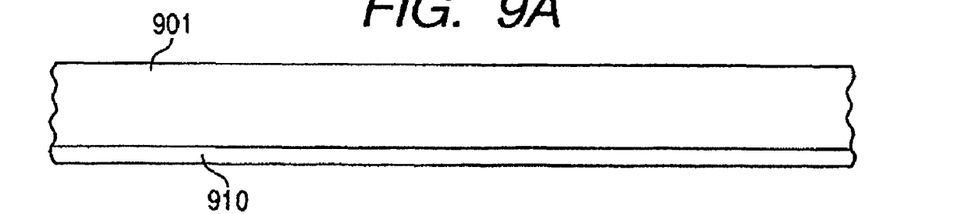
FIGS. 9A, 9B, 9C, 9D, 9E and 9F are cross sectional views showing a third embodiment in accordance with the present invention.

A deep p-type well 910 is formed by implanting a boron by using an ion implanter to an n-type substrate 901 (FIG. 9A).

Figure 9B:
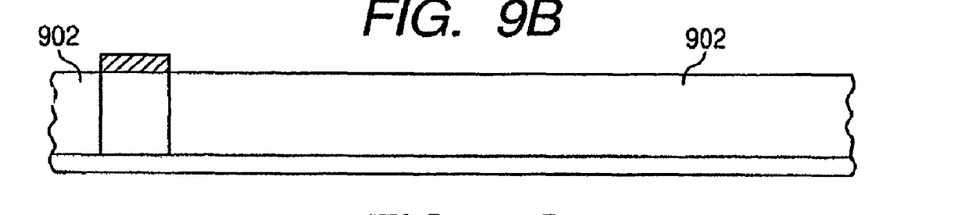
Figure 9C:
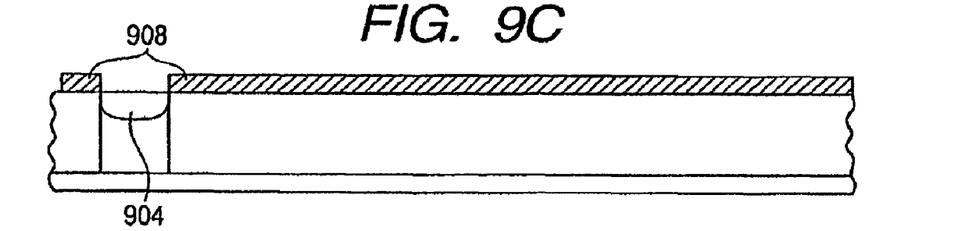

A potential blocking layer to the n-type and a p-type well 902 are prepared by ion implanting the boron (FIG. 9B). Next, an n-type semiconductor region 904 of the photo diode is formed (FIG. 9C).

Figure 9D:
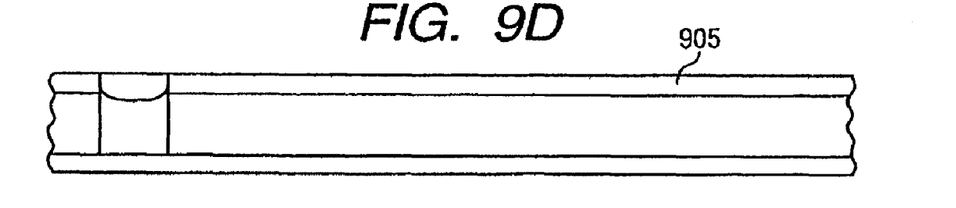

Next, a first semiconductor region 905 is formed by implanting an arsenic to an entire surface of the substrate in accordance with an ion implanting method (FIG. 9D).

Figure 9E:
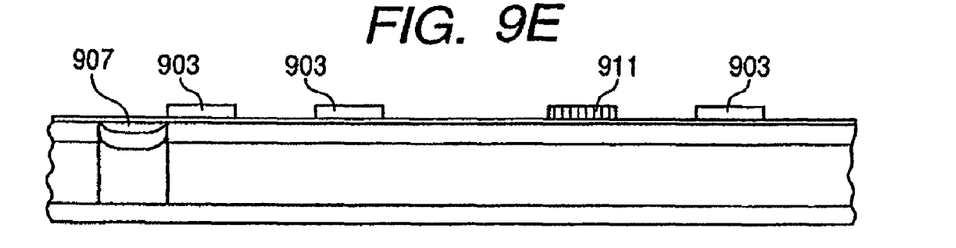

Next, after forming the gate oxide film in an entire surface of the substrate surface, the patterning is executed by forming the poly-silicon control electrode in which the phosphor is doped at a high density. Next, a p-type semiconductor region 907 in which a surface impurity density is high, and a gate electrode 911 of the buried channel type MOS transistor doped by the boron are formed by forming a drain pattern of the photo resist on the photodiode of the substrate surface and in a partial region of the control electrode, and implanting the boron by using the gate electrode of the transfer MOS transistor as the mask (FIG. 9E).

Figure 9F:
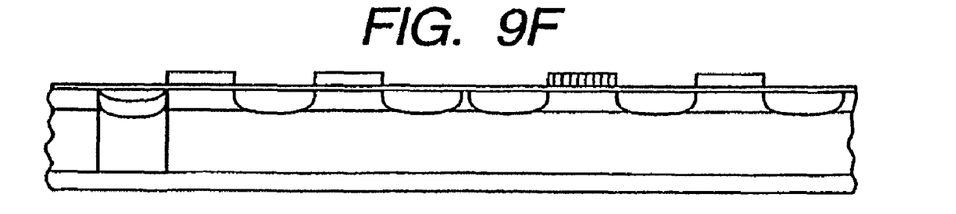

Thereafter, there are formed an n-type MOS transistor and a p-type MOS transistor, including the peripheral circuit portion (not shown) in accordance with the normal semiconductor process (FIG. 9F).

In the present embodiment, the conductive type of the gate electrode of the MOS transistor is formed by being differentiated between the buried channel type and the surface channel type. In particular, the gate electrode of the buried channel type MOS transistor is formed by implanting the same conductive type ion as the semiconductor region arranged in the region below the gate electrode and between the source drain regions, and implanting the reverse conductive type ion to the gate electrode of the surface channel type MOS transistor.

As a result, it is possible to form the buried channel type MOS transistor and the other surface channel type MOS transistor on the same substrate on the basis of the simple structure and process. The threshold value can be controlled on the basis of the impurity density of the gate electrode and the gate voltage. Further, the MOS transistor in accordance with the present embodiment tends to become a depression type MOS transistor, however, the embedded type MOS transistor used in the source follower can be used also in the depression type. Further, the other MOS transistors may be set in an off state by applying a negative voltage to the gate voltage. Further, in particular, in the transfer MOS transistor, it is possible to employ a drive method in which the signal charge is transferred to the FD during the photoelectric conversion.

The noise can be lowered to about one third in the case that the buried channel type MOS transistor is used in the source follower portion as in the present embodiment in comparison with the noise in the source follower portion in the case that all are formed by the surface channel type MOS transistor, whereby an improve characteristic can be obtained.

Embodiment 4

Figure 6:
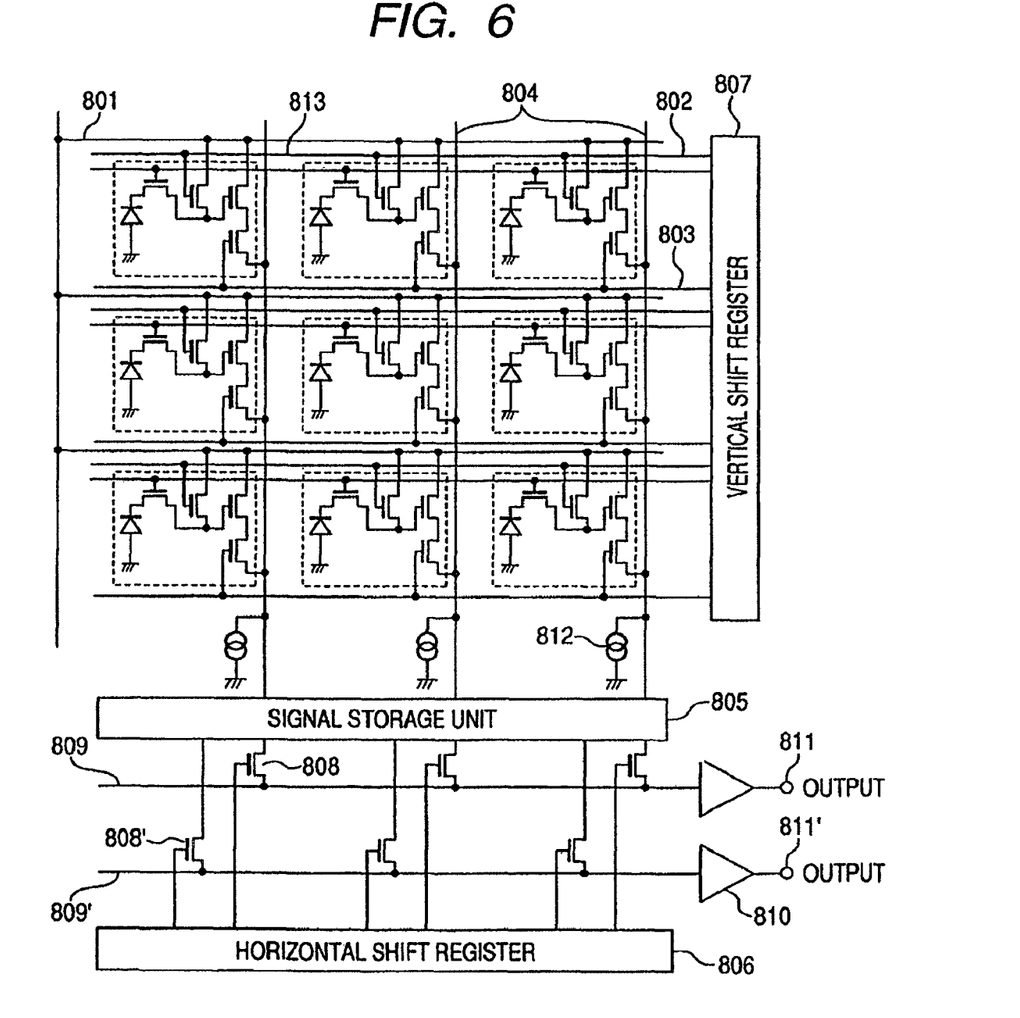
FIG. 6 is a view of an equivalent circuit including a reading circuit of an area sensor using the present invention.

There is manufactured an area sensor which uses a photodiode 505 and a transfer MOS transistor Q1 in accordance with the embodiments 1 to 3, is constituted by a pixel structure shown in FIG. 5 and is constituted by a read circuit shown in FIG. 6.

In FIG. 5, the photodiode 505 and a transfer switch Q1 of the transfer MOS transistor transfer are provided. Reference symbol Q2 denotes a reset switch of a reset MOS transistor for resetting a diffusion floating region, reference symbol Q3 denotes a input MOS transistor of a source follower amplifier circuit formed by a buried channel type MOS transistor connected to the gate in the diffusion floating region and connected as a load of a source side, and reference symbol Q4 denotes a selecting switch for selecting a read pixel.

FIG. 6 shows a solid state image pickup device in which the pixel cell of the photoelectric conversion device structured by them is used in three rows and three lines.

A description will be given below of a basic operation of FIGS. 5 and 6. There are executed a reset operation of inputting a reset voltage to an input gate of the source follower by the reset switch Q2, and a row selection by the selecting switch Q4.

A gate in a floating diffusion region of an input node of the source follower is set to a floating, a noise component constituted by the reset noise and a fixed pattern noise such as a dispersion of the threshold voltage of the source follower MOS and the like are read, and an information thereof is temporarily stored in a signal storage unit 805.

Thereafter, the transfer switch Q1 is opened and closed, a stored charge of the photodiode generated by the light signal is transferred to the input node of the source follower, and a sum of the noise component mentioned above and the light signal component is read, and is stored in the signal storage unit 805.

A signal of the noise component and a signal of the sum of the noise component and the light signal component are respectively read to common signal lines 809 and 809' via transfer switches 808 and 808' to the common signal line by conducting the transfer switch of a common signal line 1 (808) and a common signal line 2 (808'), and are respectively output as outputs 811 and 811' via each of output amplifiers 810.

Thereafter, the light signal component is taken out by removing the reset noise and the fixed pattern noise by acquiring a difference between the outputs 811 and 811', and it is possible to obtain an image pickup signal having a high S/N.

The signal and the noise are evaluated by reading in accordance with the method mentioned above. As a result, it is possible to obtain a high S/N satisfying a relation dynamic range (S/N) in each of bits=75 to 85 dB.

Embodiment 5

Figure 7:
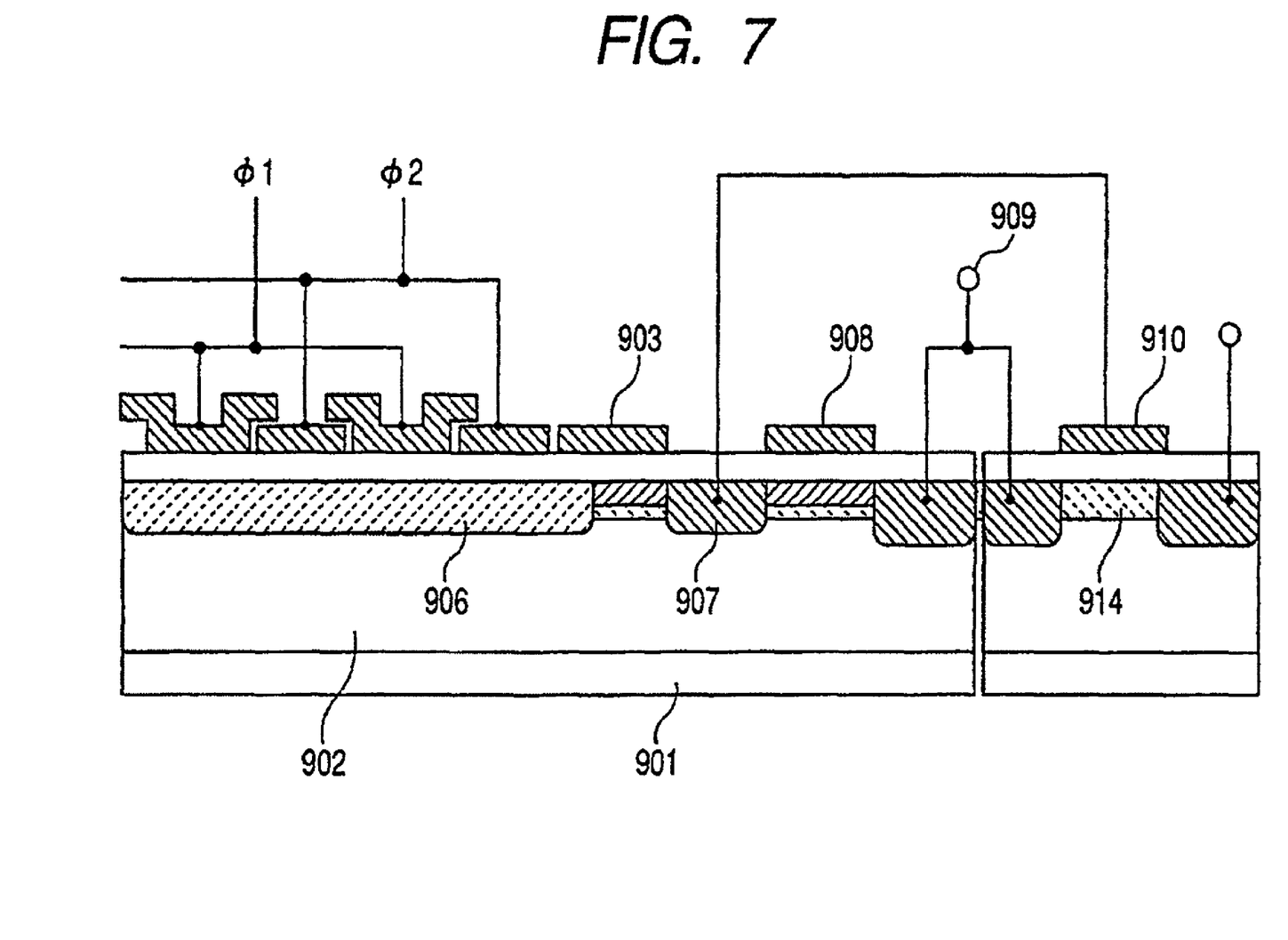
FIG. 7 is a cross sectional view showing a fifth embodiment in accordance with the present invention.

A description will be given of a fifth embodiment in accordance with the present invention with reference to FIG. 8. FIG. 7 is a view of a cross sectional structure of a CCD image sensor using the present invention. A carrier from the photodiode passes through a potential well and is transferred at a clock of $\phi 1$ and $\phi 2$.

In a final stage, a diffusion floating region FD 907 is formed in a lower portion of a side surface of a gate region 903 of the transfer MOS transistor, and the diffusion floating region FD 907 is connected to a gate of an amplifying MOS transistor of an output circuit, and outputs as a source follower amplifier circuit. The 1/f noise is reduced by using the buried channel type MOS transistor as a transistor 910 of the source follower.

Further, a source of a reset MOS transistor 908 for resetting the diffusion floating region FD 907 is connected to the diffusion floating region FD 907, and a reset power source 909 is connected to a drain thereof. The other MOS transistors than the source follower transistor are constituted by the surface channel type MOS transistor in this case. The preparing method of the surface channel type MOS transistor of the same type of the buried channel type MOS transistor and the like are the same as the embodiment mentioned above, the present invention is also applied to the CCD structure, and it is known that a great effect that the noise is reduced can be obtained.

(Application to Digital Camera)

Figure 8:
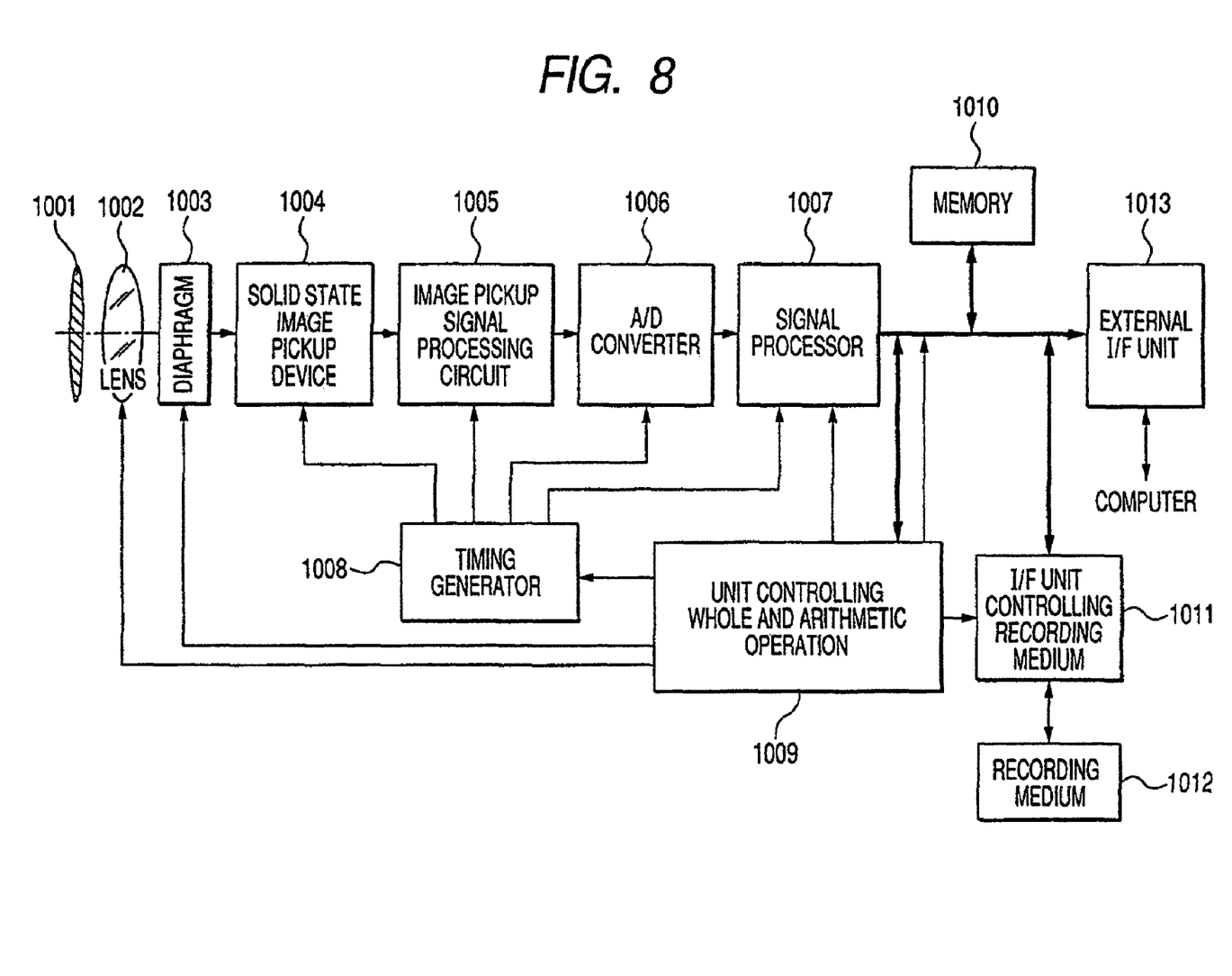
FIG. 8 is a block diagram of a structure of a camera system using the solid state image pickup device in accordance with the present invention.

FIG. 8 shows an example of a circuit block in the case that the solid state image pickup device in accordance with the present invention is applied to a camera. A shutter 1001 is provided in front of an image pickup lens 1002, and controls an exposure. A light intensity is controlled by a diaphragm 1003 as occasion demands, and an image is formed in a solid state image pickup device 1004. A signal output from the solid state image pickup device 1004 is processed by a signal processing circuit 1005, and is converted into a digital signal from an analogue signal by an A/D converter 1006. The output digital signal is arithmetically operated further by a signal processor 1007. The processed digital signal is stored in a memory 1010, and is sent to an external device through an external I/F unit 1013. The solid state image pickup device 1004, the image pickup signal processing circuit 1005, the A/D converter 1006 and the signal processor 1007 are controlled by a timing generator 1008, and an entire of the system is controlled by a unit controlling a whole and arithmetic operation 1009. In order to record the image in a recording medium 1012, the output digital signal is recorded through an I/F unit controlling recording medium 1011 controlled by the entire control portion and arithmetically operating portion.

This application claims priority from Japanese Patent Application No. 2004-099346 filed on Mar. 30, 2004, which is hereby incorporated by reference herein.

The invention claimed is:

1. A semiconductor apparatus comprising:
at least one set of a buried-channel type first conductive type MOS transistor and a surface-channel type first conductive type MOS transistor on a same substrate,
wherein a first conductive type impurity doped region is arranged below a gate electrode of each of the buried-channel type and surface-channel type MOS transistors and between source and drain regions of the buried-channel type and surface-channel type MOS transistors.

2. A solid state image pickup device comprising:
a plurality of pixels, each including a photoelectric conversion portion and an amplifying MOS transistor that amplifies a signal generated at the photoelectric conversion portion,
wherein the plurality of pixels are arranged on a substrate,
wherein a plurality of surface-channel type MOS transistors, different from the amplifying MOS transistor, are arranged on the substrate, the surface-channel type MOS transistors being of a first conductive type,
wherein the amplifying MOS transistor is a buried-channel type MOS transistor, and
wherein a first conductive type impurity doped region is provided below a gate electrode of each of the buried-channel type and surface-channel type MOS transistors, and between source and drain regions of the buried-channel type and surface-channel type MOS transistors.

3. A solid state image pickup device as claimed in claim 2, wherein the surface-channel type MOS transistor includes a second conductive type semiconductor region in a side closer to a substrate surface than the first conductive type impurity doped region.

4. A solid state image pickup device as claimed in claim 3, wherein a dose amount of the first conductive type impurity doped region is smaller than a dose amount of the second conductive type semiconductor region.

5. A solid state image pickup device as claimed in claim 2, wherein the amplifying MOS transistor is constituted by a source follower MOS transistor.

6. A solid state image pickup device as claimed in claim 2, wherein
the gate electrode of the buried-channel type MOS transistor includes a poly-silicon material in which an impurity of a second conductive type opposite to the first conductive type is implanted, and
the gate electrode of the surface-channel type MOS transistor includes a poly-silicon material in which an impurity of the first conductive type is implanted.

7. A solid state image pickup device as claimed in claim 2, wherein the source and drain regions of the amplifying MOS transistor and the source and drain regions of the surface-channel type MOS transistor have a same impurity concentration.

8. A solid state image pickup device as claimed in claim 2, wherein the source and drain regions of the amplifying MOS transistor and the source and drain regions of the surface-channel type MOS transistor are formed in a same step.

9. A solid state image pickup device as claimed in claim 2, wherein the solid state image pickup device is incorporated in an image pickup system that includes:
an image forming optical system for forming an image from a light from an object; and
a signal processing circuit for digitally converting an output signal from the solid state image pickup device, wherein the solid state image pickup device converts a formed image from the image forming optical system in a photoelectrical manner.

10. A solid state image pickup device as claimed in claim 2, wherein
each of the plurality of pixels includes a reset MOS transistor of the first conductive type for resetting an input node of the amplifying MOS transistor, and
each reset MOS transistor is a surface-channel type MOS transistor.

11. A solid state image pickup device as claimed in claim 2, further comprising a peripheral circuit that includes a plurality of surface-channel type MOS transistors of the first conductive type.

* * * * *